United States Patent [19]
Nii

[11] Patent Number: 5,289,017
[45] Date of Patent: Feb. 22, 1994

[54] SOLID STATE IMAGING DEVICE HAVING SILICON CARBIDE CRYSTAL LAYER

[75] Inventor: Keita Nii, Kyoto, Japan

[73] Assignee: Rohm Co., Ltd., Kyoto, Japan

[21] Appl. No.: 993,778

[22] Filed: Dec. 21, 1992

[30] Foreign Application Priority Data

Dec. 25, 1991 [JP] Japan .................................. 3-343221

[51] Int. Cl.$^5$ ............................................ H01L 29/78
[52] U.S. Cl. .................................. 257/77; 257/183.1; 257/222; 257/233
[58] Field of Search ................ 257/77, 183.1, 222, 257/233

[56] References Cited

FOREIGN PATENT DOCUMENTS 63-133666  6/1988  Japan .................................. 257/233
63-302554 12/1988  Japan .................................. 257/233

Primary Examiner—Rolf Hille
Assistant Examiner—Minhloan Tran
Attorney, Agent, or Firm—Nikaido, Marmelstein, Murray & Oram

[57] ABSTRACT

A solid state imaging device of claim 1, wherein the silicon carbide crystal layer is formed on a silicon substrate such that the insulating film is interposed between said silicon carbide crystal layer and said silicon substrate. Since the charge transfer part and the imaging part are formed in the silicon carbide layer, the device can normally operate even in a high-temperature or intensive radioactive ray environment the method for producing the device is also disclosed.

2 Claims, 5 Drawing Sheets

SOLID STATE IMAGING DEVICE HAVING SILICON CARBIDE CRYSTAL LAYER

BACKGROUND OF THE INVENTION

The present invention relates to a solid state imaging device, and more particularly to a solid state imaging device usable under high-temperature atmosphere or radioactive ray.

A charge coupled device developed in 1970 by Bell Laboratories has been promoting the development of solid state imaging devices. In addition, use of a silicon substrate in solid state imaging devices has enabled to improve rapidly productivity. Now, the solid state imaging device has started to be used in a wide range of applications from apparatus for consumer use such as a video apparatus, an office computer, a facsimile to machines for industrial use as machine's eye such as measuring instruments and manufacturing machines.

A solid state imaging device of the conventional type comprises an imaging part composed of a photodiode having pn junction on a silicon semiconductor crystal substrate, an accumulation part for accumulating electric charge as an image information, and a charge transfer part transferring electric charge for information processing.

Recently, there has been a tendency to use a solid state imaging device as a monitor or the like in a severe environment as in a blast furnace in which ambient temperature is high, in a location which receives intensive radioactive ray in a nuclear power plant, or under such a sever environment that blizzard is blowing in the Arctic or temperature change is remarkable in a desert. Therefore, the solid state imaging device needs to withstand a high-temperature or intensive radioactive ray.

However, semiconductor devices using silicon crystal are said to have an upper temperature limit of about 140° C. for practical use. (Refer to "Semiconductor Engineering" by Shirafuji, publication of Kyoritsu Shuppan Co., Ltd, pp. 30-35; called reference A, hereinafter). This is because the energy gap $\epsilon_g$ of silicon is as small as 1.1 eV. If this value can be increased, the semiconductor device would be able to operate normally even at a higher temperature. Accordingly, there is a problem that the solid state imaging device using silicon crystal cannot operate normally at a temperature of 140° C. or more.

Furthermore, application of radioactive ray to the semiconductor device causes a so-called "single event" phenomenon to degrade device characteristics. In the single event phenomenon, radioactive ray causes to generate pairs of electron positive hole which are then collected to an electrode in a short time to locally increase in potential, causing malfunction. The resistance against the single event phenomenon increases as the density of generated charge decreases. To decrease density of generated charge, semiconductor crystal needs to have a smaller atomic density, smaller mean atomic number and larger band gap. (Refer to "Basic Research for Development of Radiation-Resistant Electronic Device" by Nashiyama, transactions of The Institute of Electorical Engineer's of Japan 1991, pages S.4-11 to S.4-14 called reference B, hereinafter).

In view of the above-mentioned circumstances, an object of the present invention is to provide a method for producing a solid state imaging device using a semiconductor crystal having an excellent thermal stability and radioactive ray resistance property, which method is capable of realizing mass production of the device.

Another object of the present invention is to provide a solid state imaging device excellent in heat resistance and radioactive ray resistance.

SUMMARY OF THE INVENTION

According to the present invention, there is provided a solid state imaging device comprising a first-conductive type layer composed of a semiconductor crystal, a second conductive-type layer including a charge transfer part and an imaging part formed in the semiconductor crystal layer, and a charge transfer electrode part formed on said charge transfer part with an insulating film sandwiched therebetween, said semiconductor crystal layer being formed of a silicon carbide crystal layer.

According to the present invention, there is also provided a method for producing a solid state imaging device, which comprises the steps of:

(a) forming a first conductive-type region for forming a device composed of silicon carbide crystal on a silicon substrate, with an insulating film sandwiched therebetween;

(b) forming a second conductive-type region, wherein an impurity-concentration is low, in said first conductive-type region for forming said device so as to form a charge transfer part;

(c) forming a second conductive-type region, wherein impurity-concentration is high in said first conductive-type region for foming said device at a location different from that of said charge transfer part, to form an imaging part;

(d) stacking a charge transfer electrode film on the charge transfer part, with an insulating film sandwiched therebetween; and (e) forming a light-shielding film in regions other than the imaging part.

In the solid state imaging device according to the present invention, silicon carbide crystal is used for the region for forming the device instead of using silicon crystal. The band gap energy of silicon carbide is as large as 2.2 to 2.9 eV; hence the device can normally operate at a high temperature of 400° to 500° C., according to the theory of the above-mentioned reference A.

Further, with respect to the radioactive ray resistance, silicon carbide is as small as 10 in mean atomic number and as large as 2.2 to 2.9 eV in band gap energy; hence the device is markedly improved in resistance property for single-event, according to the above-mentioned reference B.

Still further, in the method according to the present invention an insulating layer is formed on a silicon substrate and locally opened to expose a portion of the silicon substrate; a silicon carbide crystal layer is epitaxially grown using the exposed portion of the silicon substrate as a seed; and the imaging part and charge transfer part are formed in the silicon carbide crystal layer. Thus, a solid state imaging device using a silicon carbide layer therein can be produced very easily.

DETAILED DESCRIPTION

Figure 1:
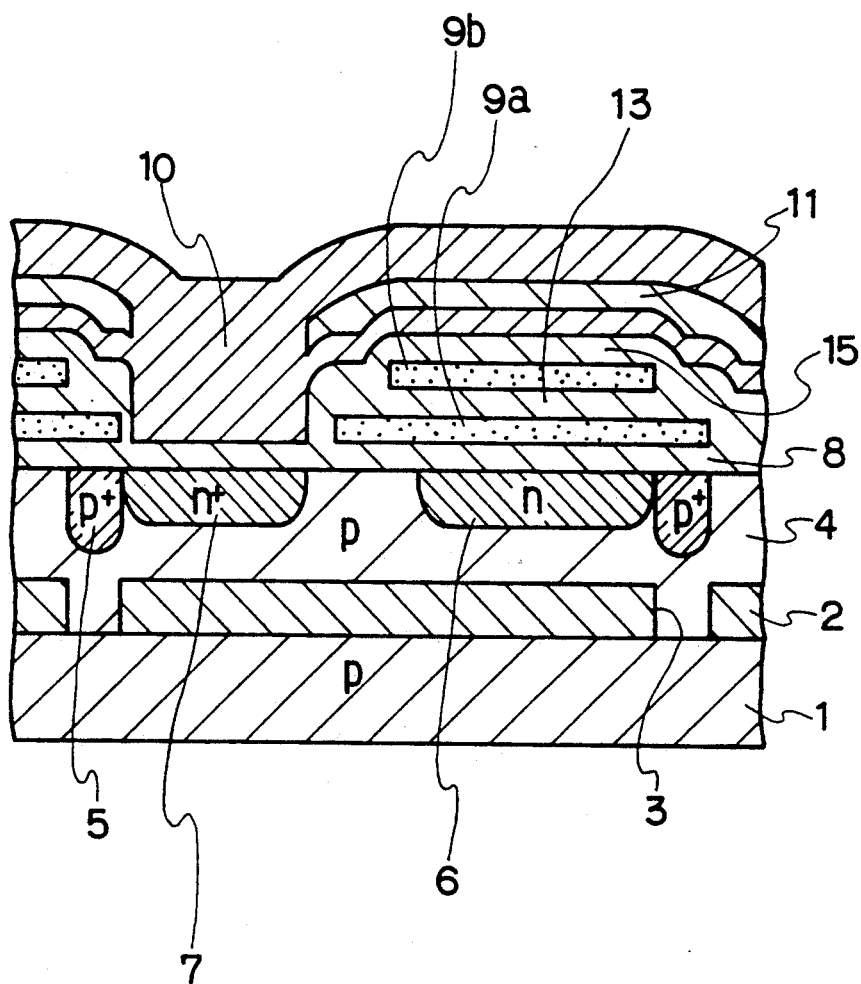
FIG. 1 is a schematic section illustrating a solid state imaging device according to an embodiment of the present invention.

Now, the present invention will be described in more detail with reference to the drawings. FIG. 1 is a schematic section illustrating a solid state imaging device according to an embodiment of the present invention.

Referring to FIG. 1, numeral 1 denoates a semiconductor silicon substrate, numeral 2 denotes a first insulating film such as of silicon oxide, numeral 4 denotes a silicon carbide layer of a first conductive-type, by numeral 5a first conductive-type region for channel-stop wherein an impurity-concentration is high numeral 6 denotes a second conductive-type region for vertical charge transfer part wherein a impurity-concentration is low, numeral 7 denotes a second conductive-type photodiode part wherein a impurity-concentration is high, numeral 8 denotes a second insulating film, and numerals 9a and 9b denote respectively lower and upper charge transfer electrodes which are stacked opposite to each other with sandwiching a second insulating film 13. There are provided a plurality of pairs of the electrodes 9a and 9b in the direction perpendicular to the face of the drawing sheet. The upper electrodes and the lower electrodes are connected in series to permit charge transfer sequentially. Numeral 10 denotes a passivation film composed of a silicon oxide deposited by plasma CVD, and numeral 11 denotes a light-shielding film formed in regions other than the photodiode part 7. Although not shown in the drawings, a horizontal charge transfer part is formed as well as the vertical charge transfer part.

In the above arrangement, optical information given from outside is converted into electric signals in the imaging part comprising the photodiode part 7 or a phototransistor. The electric signals are transferred one after another through the vertical charge transfer part to a part for information processing in which the signals are processed to exhibit an imaging function.

In this embodiment the silicon carbide crystal layer is formed on the silicon substrate with the insulating film sandwiched therebetween, to provide a region for forming a device. Although this is the best mode for forming a silicon carbide crystal layer on a substrate, the region for forming the device composed of a silicon carbide crystal layer can be formed in another way.

According to the present invention, the charge transfer part 6 and the imaging part comprising the photodiode part 7 are formed in the region 4a for forming the device made of a silicon carbide layer; hence the semiconductor operates without any trouble, with sufficiently resisting against a high temperature or intensive radioactive ray. This is because silicon carbide has a band gap energy as large as 2.2 to 2.9 eV to assure a normal operation even at a high temperature of 400° to 500° C. In addition, silicon carbide has a small mean atomic number as well as the large band gap energy to assure a markedly improved resistance property for single-event, hence a high radioactive ray resistance.

Described next is an embodiment of a method for producing a solid state imaging device according to the present invention. FIGS. 2 to 8 are each a schematic section for illustrating a step for producing a solid state imaging device according to the embodiment of the present invention.

Figure 2:
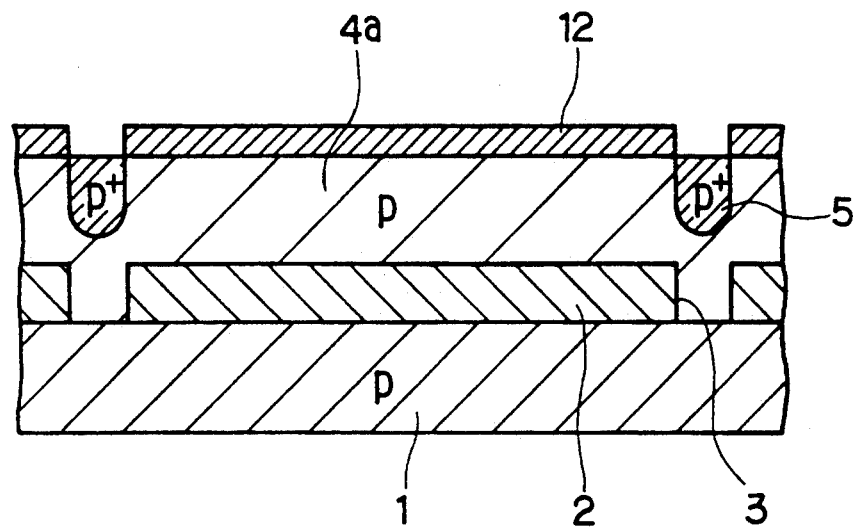
FIGS. 2 to 8 are each a schematic section for illustrating a step of producing a solid state imaging device according to an embodiment of the present invention.

Referring first to FIG. 2, a first conductive-type layer made of a silicon carbide crystal is formed on a silicon substrate with sandwiching an insulating film therebetween, to form a device formation region 4a.

In an exemplary case, a p-type silicon substrate was subjected to a heat treatment at about 950° C. for about 60 minutes to form a silicon oxide film 2 of 0.5 μm in thickness on the surface of the substrate 1. A first opening 3 was then formed in the silicon oxide film 2 by a common photoresist process to expose a portion of the silicon substrate 1. Using the exposed portion of the silicon substrate 1 as a seed, a p-type silicon carbide crystal layer 4 was epitaxially and laterally grown in about 0.5 μm thickness on the silicon oxide film 2. The epitaxial growth was carried out under the following conditions; $SiH_4$ gas at 0.1 sccm, $C_3H_3$ gas at 0.1 sccm as source gases, TMA (trimethylaluminum) gas at 0.01 sccm as dopant, and hydrogen gas at 1 slm as carrier gas were mixed for use; the substrate temperature was set to about 1350° C.; and the growth was carried out for about 60 minutes. The silicon carbide crystal layer thus epitaxially grown has substantially the same lattice plane as that of the silicon substrate 1. The surface of the silicon carbide crystal layer 4 might be etched back to be planarized, if necessary. Thereafter, the surface of the layer 4 was covered with a resist film 12 which was in turn formed with an opening by a photoresist process. Through the opening, boron ion (B+) was implanted under the condition wherein an acceleration energy is 50 key and a dose is 5E 14 $cm^{-2}$. The implanted ion was diffused to form a p+-type channel-stop region 5. The region 4a for forming the device is enclosed by this channel-stop region 5.

Figure 3:
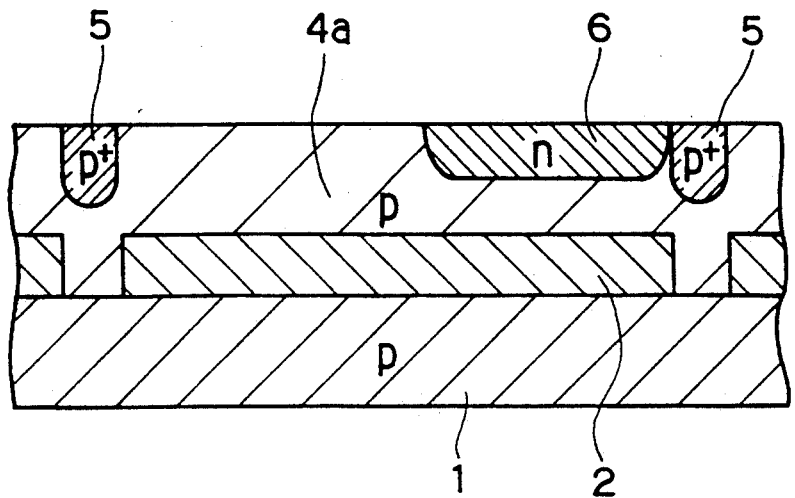

Referring next to FIG. 3, an impurity-doped region is formed locally in the silicon carbide crystal layer 4, to form a charge transfer part.

In the exemplary case, by a photoresist process similar to that described above, a resist fim located in a region intended for a vertical charge transfer part 6 was etched away. Phosphorus ion (P+) was then implanted under the condition wherein an acceleration energy of 50 key and a dose of 1E 14 $cm^{-2}$, and diffused to form the vertical charge transfer part 6. In this implantation the substrate temperature was set to 300° to 400° C. to activate the impurity implanted in the silicon carbide layer.

Figure 4:
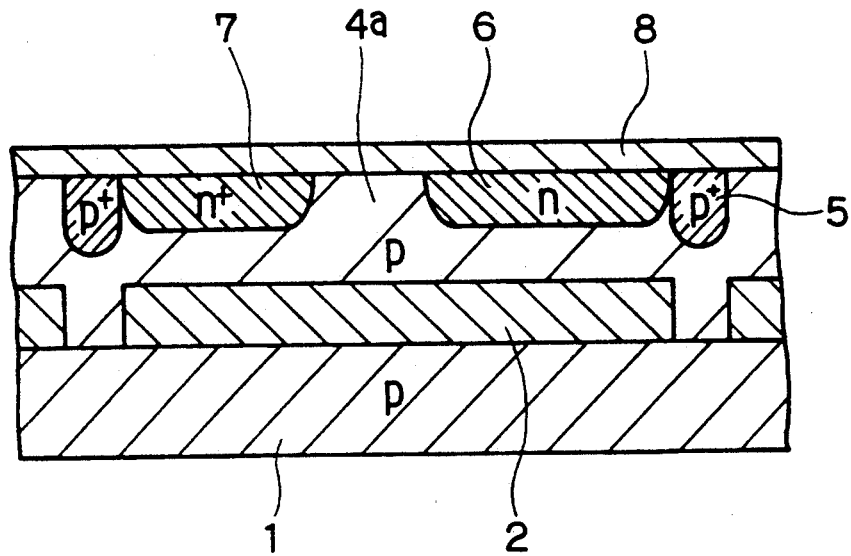

Referring in turn to FIG. 4, a high impurity-concentration region of the second conductive-type is formed in the region for forming the device at a location different from that of the charge transfer part 6, to form a photodiode part 7 serving as an imaging part.

In the exemplary case, an opening was formed by a photoresist process as in the same manner described above. Phosphorus ion (P+) was implanted under the condition wherein an accelaration energy is 30 key and a dose is 5 E 13 $cm^{-2}$, then diffused to form a n+-type region. The n+-type region forms a pn junction with the p-type silicon carbide crystal layer, thus forming the photodiode part 7. Thereafter, the resulting structure was subjected to a heat treatment at about 1000° C. for about 30 minutes, to form a silicon oxide film 8 of about 500 Å in thickness.

Figure 5:
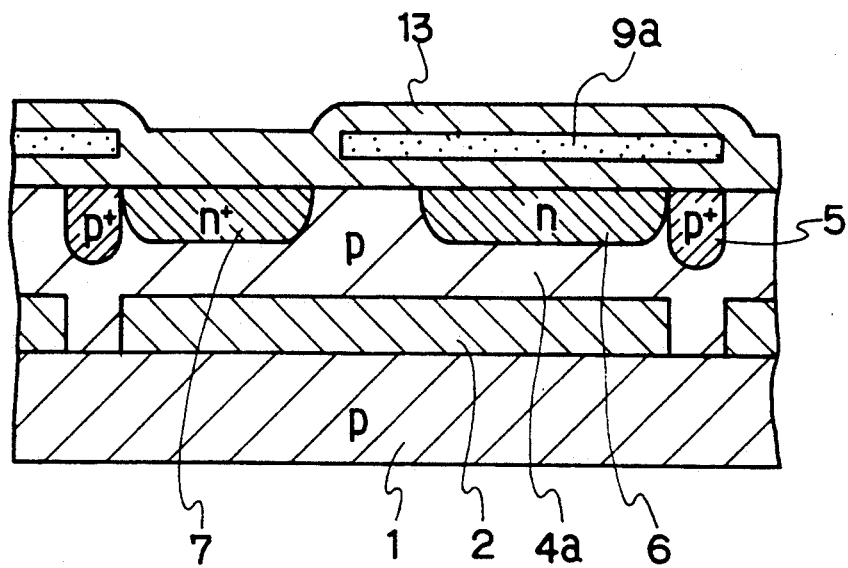

Referring next to FIG. 5, a lower charge transfer electrode 9a is formed on the insulating film located on the charge transfer part 6.

In the exemplary case, a n-type polysilicon film was deposited in about 3000 Å thickness by LPCVD, followed by removal of a portion of the polysilicon film located in the photodiode part 7 by a photoresist process and reactive ion etching (hereinafter referred to as "RIE"), to form the lower charge transfer electrode 9a. In this case, a plurality of electrodes of this type were formed in the direction perpendicular to the face of the drawing sheet. Thereafter, by thermal oxidation of about 1000° C. for about 30 minutes as in the same manner described above, a silicon oxide film 13 was formed in about 500 Å thickness to cover the lower charge transfer electrode 9a.

Figure 6:
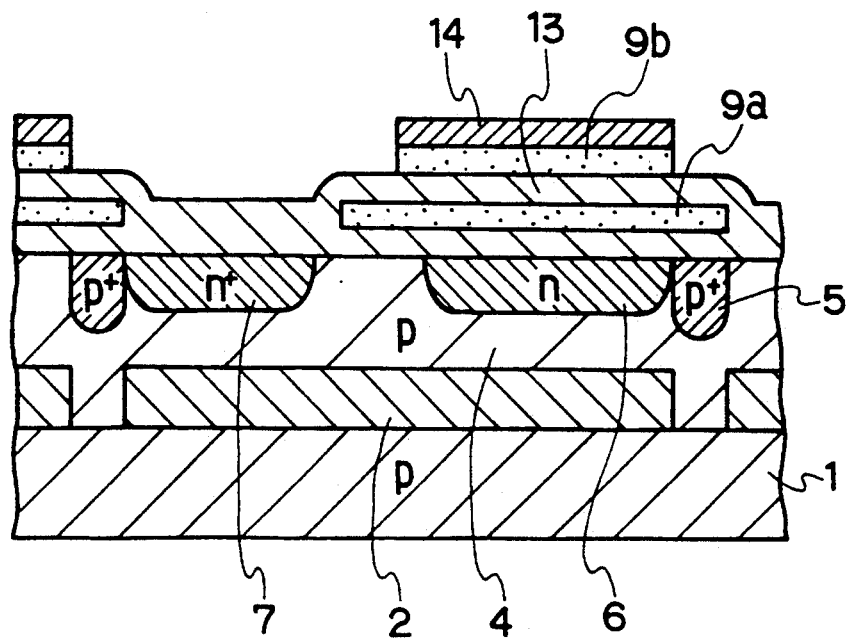

Referring to FIG. 6, an upper charge transfer electrode 9b is formed.

In the exemplary case, a polysilicon film was deposited in about 3000 Å thickness by LPCVD as in the same manner described above, followed by removal of a portion of the polysilicon film located above the photodiode part 7 by a photoresist process and RIE using a resist film 14 as a mask, to form the upper charge transfer electrode 9b. A plurality of electrodes of this type were formed in the direction perpendicular to the face of the drawing sheet. The upper electrodes were connected to the lower electrodes by turns, so as to provide a serial connection. The charge transfer electrode comprising the lower electrode 9a and the upper electrode 9b forms a capacitor part. A series of capacitor parts formed in the direction perpendicular to the face of the drawing sheet serve to transfer charge sequentially.

Figure 7:
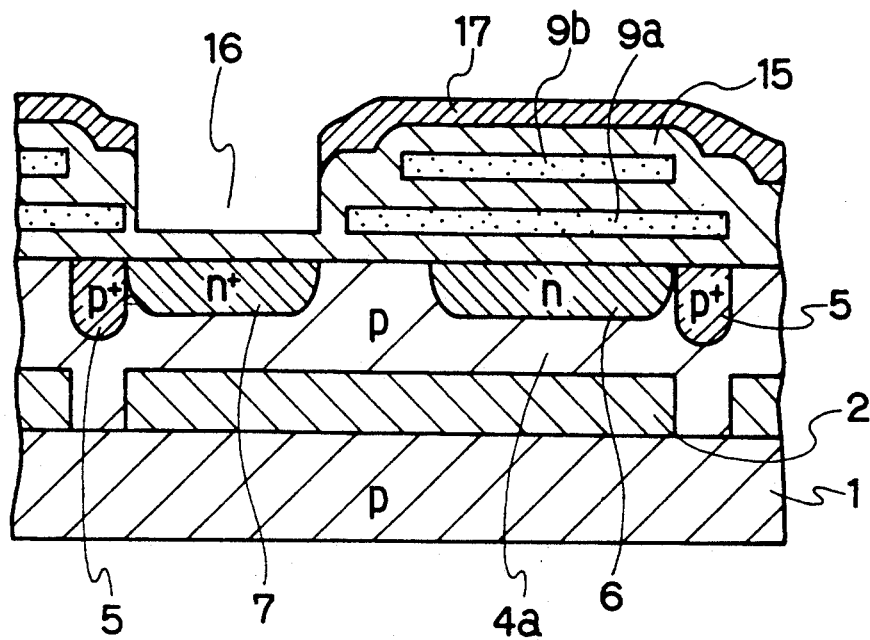
Figure 8:
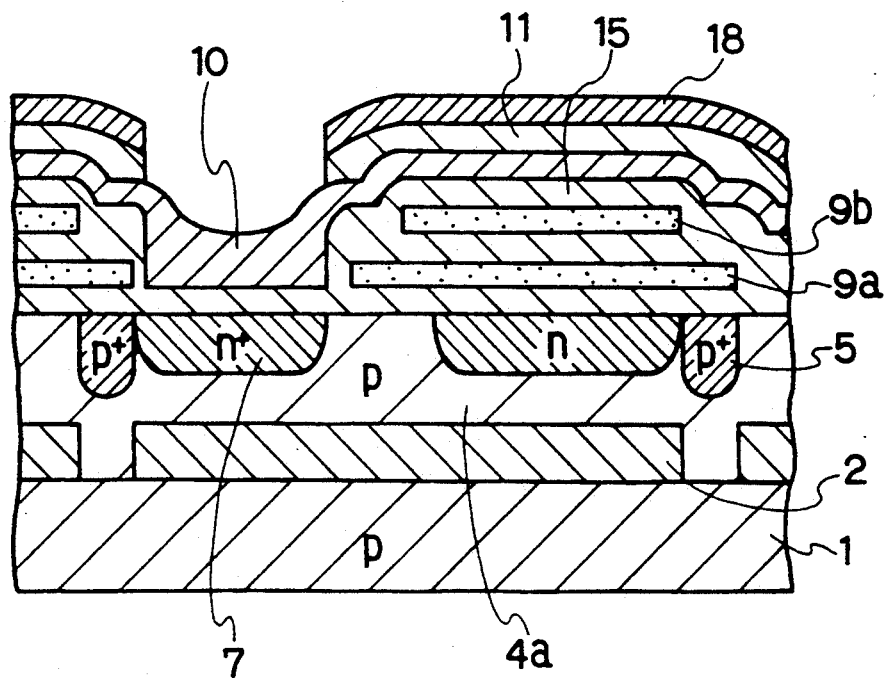

Referring finally to FIGS. 7 and 8, a light-shielding film 11 is formed on the insulating film located in regions other than the photodiode part 7, followed by coverage of the entire surface of the resulting structure with a passivation film.

In the exemplary case, a silicon oxide film 15 was formed in about 500 Å thickness by a heat treatment at a substrate temperature of about 1000° C. for about 30 minutes. A portion of the silicon oxide film 15 located above the photodiode part 7 was removed by a photoresist process and by RIE using a resist film as a mask (refer to FIG. 7). Thereafter, a silicon oxide film obtained by plasma-activated chemical vapour deposition method (hereinafter referred to as "P-SiO$_x$") was deposited in about 5000 Å thickness on the entire surface of the resulting structure. Further, aluminum was deposited in about 5000 Å thickness by sputtering to form the light-shielding film 11. A portion of the light-shielding film 11 existing above the photodiode part 7 was etched away by a photoresist process and by RIE using a resist film 18 as mask. Finally, P-SiO$_x$ was deposited in about 5000 Å thickness on the entire surface of the resulting to structure by plasma CVD. Thus, a solid state imaging device as shown in FIG. 1 was completed.

Although the embodiment has been explained with using an example in which polysilicon was used for the charge transfer electrode, it is desired that polysilicon carbide is used therefor in view of heat resistance and radioactive ray resistance. A polysilicon carbide layer can be obtained by vapor deposition at a relatively low temperature of about 900° C. for about 30 minutes, wherein SiH$_4$ gas and C$_3$H$_3$ gas as source gases and PH$_3$ gas as dopant are mixed with a carrier gas.

As has been described above, according to the present invention a charge transfer part and an imaging part are formed in a silicon carbide layer, hence, there can be obtained an imaging device capable of normally operating even in a high-temperature or intensive-radioactive ray environment. As a result, such a device can be used for monitoring in a severe environment such as a blast furnace or a nuclear power plant, or in a severe natural environment such as the Arctic, thus exhibiting an effect so as to be applicable in a broad range.

Further, according to the method of the present invention a silicon carbide crystal layer is formed on a silicon substrate with sandwiching an insulating film, hence the silicon carbide crystal layer can be formed easily and stably. Thus, the method of the present invention can be applied to mass production, thereby reducing a production cost for obtaining a solid state imaging device having a thermal stability and radioactive ray resistance.

Though several embodiments of the present invention are described above, it is to be understood that the present invention is not limited only to the above-mentioned, various changes and modifications may be made in the invention without departing from the spirit and scope thereof.

What is claimed is:

1. A solid state imaging device comprising a first-conductive type layer composed of a semiconductor crystal, a second conductive-type layer including a charge transfer part and an imaging part formed in the semiconductor crystal layer, and a charge transfer electrode part formed on said charge transfer part with an insulating film sandwiched therebetween, said semiconductor crystal layer being formed of a silicon carbide crystal layer.

2. A solid state imaging device of claim 1, wherein the silicon carbide crystal layer is formed on a silicon substrate such that the insulating film is interposed between said silicon carbide crystal layer and said silicon substrate.

* * * * *